United States Patent
Kim et al.

(10) Patent No.: US 11,187,371 B2
(45) Date of Patent: Nov. 30, 2021

(54) APPARATUS FOR COUPLING A PLURALITY OF ELECTRONIC DEVICES

(71) Applicant: SAMSUNG ELECTRONICS CO., LTD., Suwon-si (KR)

(72) Inventors: Jun Pyo Kim, Ansan-si (KR); Gyoo Sang Choi, Suwon-si (KR); Seong Ho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/790,774

(22) Filed: Oct. 23, 2017

(65) Prior Publication Data
US 2018/0112819 A1    Apr. 26, 2018

Related U.S. Application Data

(60) Provisional application No. 62/411,884, filed on Oct. 24, 2016.

(30) Foreign Application Priority Data

Dec. 20, 2016  (KR) .......................... 10-2016-0174250

(51) Int. Cl.
*F16M 13/02*    (2006.01)
*H04N 5/64*    (2006.01)
(Continued)

(52) U.S. Cl.
CPC .............. *F16M 13/02* (2013.01); *H04N 5/64* (2013.01); *H05K 5/0017* (2013.01); *H05K 7/12* (2013.01)

(58) Field of Classification Search
CPC ........ F16M 13/02; H04N 5/64; H05K 5/0017; H05K 7/12
See application file for complete search history.

(56) References Cited

U.S. PATENT DOCUMENTS 3,955,790 A * 5/1976 Ballin .................. A47G 1/1606
                                          248/489
6,330,773 B1 * 12/2001 MacDonald .......... E04B 2/7425
                                          52/220.7
(Continued)

FOREIGN PATENT DOCUMENTS

CN    102402029    4/2012
CN    102970590    3/2013
(Continued)

OTHER PUBLICATIONS

Extended European Search Report dated Mar. 15, 2018, in corresponding European Patent Application No. 17197853.9, 7 pgs.
(Continued)

*Primary Examiner* — James Wu
*Assistant Examiner* — Christopher L Augustin
(74) *Attorney, Agent, or Firm* — Staas & Halsey LLP

(57) ABSTRACT

A coupling apparatus is provided. The coupling apparatus includes a first coupling part coupled with a first electronic device, a second coupling part coupled with a second electronic device, and a connecting part coupled with the first coupling part and the second coupling part, respectively, to connect the first coupling part and the second coupling part. A distance between the first coupling part and the second coupling part is adjusted depending on a position where at least one of the first coupling part and the second coupling part is coupled with the connecting part. Other embodiments of the present disclosure are possible.

13 Claims, 12 Drawing Sheets

(51) Int. Cl.
*H05K 5/00* (2006.01)
*H05K 7/12* (2006.01)

(56) References Cited

U.S. PATENT DOCUMENTS

| | | | | |
|---|---|---|---|---|
| 8,523,119 B1 * | 9/2013 | Greer | | E03D 11/143 |
| | | | | 248/224.8 |
| 9,075,290 B1 * | 7/2015 | Thieman | | G03B 17/561 |
| 9,101,211 B2 * | 8/2015 | Cabal Velarde | | A47B 88/956 |
| 2002/0027613 A1 * | 3/2002 | Tajima | | G06F 1/1601 |
| | | | | 348/552 |
| 2005/0146251 A1 * | 7/2005 | Gillengerten | | A47B 81/06 |
| | | | | 312/8.16 |
| 2006/0040713 A1 * | 2/2006 | Kim | | H04N 5/74 |
| | | | | 455/566 |
| 2007/0012836 A1 * | 1/2007 | Krueger | | H05K 7/1421 |
| | | | | 248/239 |
| 2009/0039212 A1 * | 2/2009 | Whalen | | A47B 81/065 |
| | | | | 248/158 |
| 2009/0101777 A1 * | 4/2009 | Kim | | F16M 11/126 |
| | | | | 248/220.21 |
| 2009/0200439 A1 * | 8/2009 | Bremmon | | F16M 11/10 |
| | | | | 248/183.1 |
| 2010/0044324 A1 * | 2/2010 | Gerace | | A47B 81/061 |
| | | | | 211/26.2 |
| 2011/0157805 A1 * | 6/2011 | Mi | | F16M 11/24 |
| | | | | 361/679.22 |
| 2011/0174944 A1 * | 7/2011 | Fredette | | F16M 13/02 |
| | | | | 248/220.22 |
| 2011/0198456 A1 * | 8/2011 | Fiedler | | F16M 11/08 |
| | | | | 248/122.1 |
| 2012/0255919 A1 * | 10/2012 | Jones | | F16M 11/10 |
| | | | | 211/26 |
| 2013/0069507 A1 | 3/2013 | Dowling et al. | | |
| 2013/0206944 A1 * | 8/2013 | Merck | | H01F 27/02 |
| | | | | 248/309.1 |
| 2013/0299651 A1 * | 11/2013 | McGowan | | H02G 3/04 |
| | | | | 248/201 |
| 2014/0027091 A1 | 9/2014 | Sculler et al. | | |
| 2014/0270910 A1 * | 9/2014 | Sculler | | H04N 5/64 |
| | | | | 403/109.1 |
| 2015/0264823 A1 * | 9/2015 | Shirley | | F16M 13/02 |
| | | | | 248/287.1 |
| 2016/0346889 A1 * | 12/2016 | Gong | | B23Q 11/1084 |
| 2018/0075786 A1 * | 3/2018 | Thul | | G06F 3/147 |
| 2018/0235361 A1 * | 8/2018 | Ching | | A47B 21/03 |
| 2018/0235363 A1 * | 8/2018 | Murphy | | F16M 11/046 |

FOREIGN PATENT DOCUMENTS

| | | |
|---|---|---|
| JP | 7-236079 | 9/1995 |
| KR | 10-2007-0058929 | 6/2007 |

OTHER PUBLICATIONS

Chinese Office Action dated Jun. 30, 2020 from Chinese Patent Application No. 201711005499.5, 23 pages.

\* cited by examiner

APPARATUS FOR COUPLING A PLURALITY OF ELECTRONIC DEVICES

CROSS-REFERENCE TO RELATED APPLICATION(S)

This application claims the benefit under 35 U.S.C. § 119(a) of a Korean patent application filed on Dec. 20, 2016 in the Korean Intellectual Property Office and assigned Serial number 10-2016-0174250; and United States Provisional patent application filed on Oct. 24, 2016 in the United States Patent and Trademark Office and assigned Ser. No. 62/411,884, the entire disclosure of which is hereby incorporated by reference.

TECHNICAL FIELD

The present disclosure relates to an apparatus for coupling a plurality of electronic devices.

BACKGROUND

A display device which displays an image in a display may include the display, a speaker, and a driving circuit which drives the display and the speaker. The display device may receive content from an external electronic device to display an image.

Since a display device uses a plasma display panel (PDP), a liquid crystal display (LCD), and a light emitting diode (LED), the display device becomes thin and large in comparison with a cathode-ray tube (CRT). Since the display device becomes thin and large, demands for mounting the display device onto a wall gradually increase.

In addition, the display device is connected to a plurality of external devices, such as a speaker, which include various functions, such that functions of the display device are extended and a variety of content is provided to users.

Since a display device is connected to an external electronic device by a wired or wireless manner, content may be provided to users through various manners. The display device is connected to a speaker device by a wired or wireless manner, and audio signals of content being played may be output through the speaker device. In case of the speaker device, information provided to users may be changed depending on the position at which the audio signal is output. In case of a sound-bar, in which a plurality of speakers are integrated in one device, generally, the sound-bar and a display may be disposed together to output received audio signals.

In the case that a display device is mounted onto a wall, an external speaker device connected to the display device may be mounted onto the wall where the display device is mounted. In this case, it is difficult to mount a plurality of speakers onto the wall. In the case that one speaker device including a plurality of speakers is mounted onto the wall, it is difficult for the speaker device to be installed horizontally on the display device and to be mounted to have a predetermined distance with respect to the display device.

SUMMARY

Aspects of the present disclosure are to address at least the above-mentioned problems and/or disadvantages and to provide at least the advantages described below.

Various embodiments of the present disclosure provide a coupling apparatus, which couples a speaker device outputting audio signals with the display device to mount the speaker device and the display device onto the wall, together, when the display device is wall-mounted.

In accordance with an aspect of the present disclosure, a coupling apparatus is provided. The coupling apparatus includes a first coupling part to be coupled with a first electronic device, a second coupling part to be coupled with a second electronic device, and a connecting part to be coupled with the first coupling part and the second coupling part, respectively, so that the first coupling part and the second coupling part are connected through the connecting part. A distance between the first coupling part and the second coupling part is adjustable depending on a position where at least one of the first coupling part and the second coupling part is coupled with the connecting part.

In accordance with an aspect of the present disclosure, a display device is provided. The display device includes a housing to form an outer appearance of the display device, the house having an opening surface, a display placed in the housing and having one surface exposed to an outside through the opening surface of the housing, and a coupling device to be coupled with the housing and an external electronic device. The coupling device includes a first coupling part to be coupled with the housing, a second coupling part to be coupled with the external electronic device, and a connecting part to be coupled with the first coupling part and the second coupling part, respectively, so that the first coupling part and the second coupling part are connected through the connecting part device. A distance between the first coupling part and the second coupling part is adjustable depending on a position where at least one of the first coupling part and the second coupling part is coupled with the connecting part.

In accordance with an aspect of the present disclosure, a speaker device is provided. The speaker device includes a housing to form an outer appearance of the speaker device, a speaker disposed in the housing, and a coupling device. The coupling device includes a first coupling part to be coupled with an external electronic device, a second coupling part to be coupled with the housing, and a connecting part to be coupled with the first coupling part and the second coupling part, respectively, so that the first coupling part and the second coupling part are connected through the connecting part. A distance between the first coupling part and the second coupling part is adjustable depending on a position where at least one of the first coupling part and the second coupling part is coupled with the connecting part.

The first coupling part includes coupling part holes and the first plurality of coupling holes further includes a first guide hole extended vertically so that when a coupling member temporarily couples the first coupling part with the connection part, the coupling member is guided by the first guide hole to align other ones of the first plurality of coupling holes with corresponding coupling part holes of the first coupling part, thereby the distance between the first coupling part and the second coupling part is adjusted.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
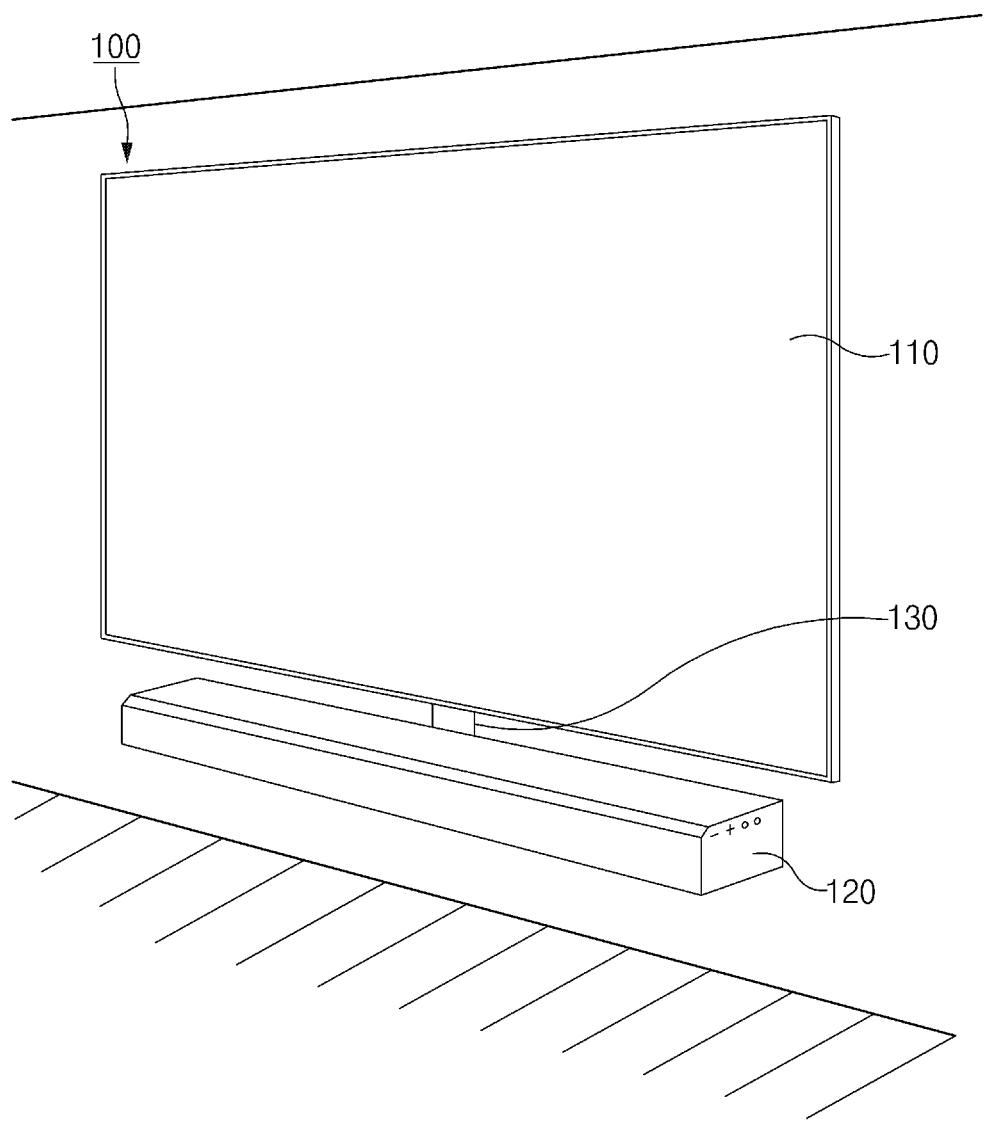
FIG. 1 is a view illustrating a display system according to various embodiments of the present disclosure.

Hereinafter, various embodiments of the present invention may be described with reference to accompanying drawings. Accordingly, those of ordinary skill in the art will recognize that modification, equivalent, and/or alternative on the various embodiments described herein can be variously made without departing from the scope and spirit of the present invention. With regard to description of drawings, similar elements may be marked by similar reference numerals.

In this disclosure, the expressions "have", "may have", "include" and "comprise", or "may include" and "may comprise" used herein indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used in this disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing part (CPU) or an application processor) which performs corresponding operations by executing one or more software programs which are stored in a memory device.

Terms used in this disclosure are used to describe specified embodiments and are not intended to limit the scope of the present invention. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this disclosure. In some cases, even if terms are terms which are defined in this disclosure, they may not be interpreted to exclude embodiments of this disclosure.

FIG. 1 is a view illustrating a display system according to various embodiments of the present disclosure.

Referring to FIG. 1, a display system 100 may include a first electronic device 110, a second electronic device 120, and a coupling apparatus 130.

The first electronic device 110 may be a display device which plays content. For example, the first electronic device 110 may use various devices, which play content, such as a TV, a monitor, an electronic frame, etc. The first electronic device 110, for example, may play content saved in the first electronic device 110. The first electronic device 110, for another example, may be connected to a source device through a wired communication interface (e.g. a high definition multimedia interface (HDMI), a digital video/visual interactive (DVI), a video graphics array (VGA), etc.) or a wireless communication interface (e.g. Bluetooth, near field communication (NFC), Wi-fidelity (Wi-Fi), etc.), thereby receiving and playing content.

According to an embodiment, in the case that the first electronic device 110 is a display device, the display device may include a housing forming an outer appearance of the display device and a display exposed to the outside though one surface of the housing. Although not described, an element for displaying an image through the display may be further provided.

According to an embodiment, the first electronic device 110 may display an image which is included in content being played. According to an embodiment, the first electronic device 110 may output audio signals which are included in the played content. For example, the first electronic device 110 may be connected to the second electronic device 120 and output sound signals through the external second electronic device 120 connected to the first electronic device 110.

The second electronic device 120 may be a speaker device which outputs audio signals received from the first electronic device 110. The first electronic device 110 may transmit the audio signals included in content being played to the second electronic device 120, and the second electronic device 120 may output the audio signals. For example, the second electronic device 120 may be connected to the first electronic device 110 to receive the audio signals. The second electronic device 120, for example, may be connected to the first electronic device 110 through a wired interface (e.g. a Sony Philips digital interface (SPDIF), a universal serial bus (USB), an auxiliary (AUX), etc.) or a wireless interface (e.g. Bluetooth, near field communication (NFC), Wi-Fi (wireless-fidelity)), etc.)

According an embodiment, in the case that the second electronic device 120 is a speaker device, the speaker device may include a housing forming an outer appearance of the speaker device and a speaker disposed in the housing. Although not described, an element for outputting sound through the speaker may be further provided.

According to an embodiment, the second electronic device 120 may be integrated in one element. For example, the second electronic device 120 may include a sound-bar, which is integrated in a plurality of an amplifier, a decoder, etc. to implement a stereophonic sound of multi-channel (e.g. two-channel, 2.1-channel, 4-channel, 5.1-channel, etc.).

The coupling apparatus 130 may couple the first electronic device 110 with the second electronic device 120. For example, the coupling apparatus 130 may be coupled with the first electronic device 110 and the second electronic device 120, respectively. Therefore, the second electronic device 120 may be connected to the first electronic device 110 through the coupling apparatus 130.

Figure 2A:
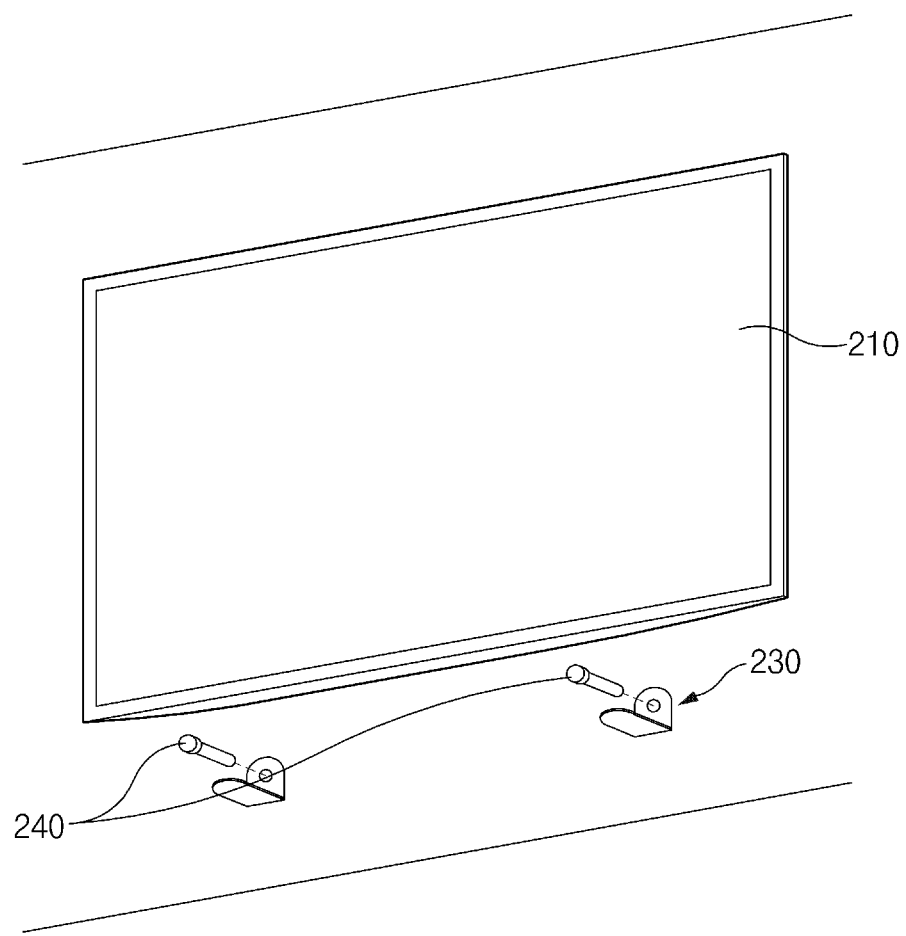
FIGS. 2A and 2B are views illustrating that a first electronic device and a second electronic device are respectively wall-mounted.
Figure 2B:
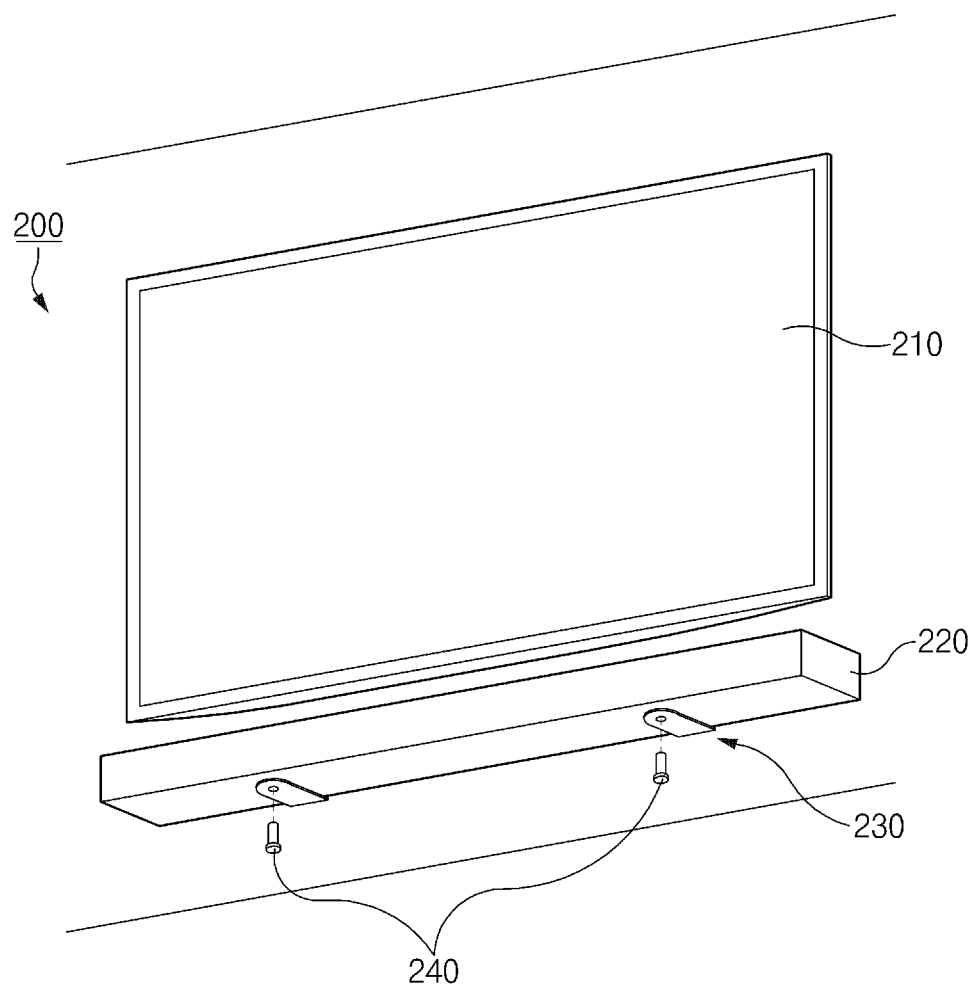

FIGS. 2A and 2B are views illustrating that a first electronic device and a second electronic device are respectively wall-mounted.

Referring to FIGS. 2A and 2B, first and second electronic devices 210 and 220 of a display system 200 may be wall-mounted, respectively. Namely, the second electronic device 220 may be separately mounted onto a wall, regardless of the first electronic device 210.

Referring to FIG. 2A, a bracket 230 may be fixed onto the wall to mount the first electronic device 210 onto the wall. The bracket 230, for example, may be fixed onto the wall using a coupling member 240 (e.g. a screw).

Referring to FIG. 2B, the second electronic device 220 may be coupled with the bracket 230 fixed onto the wall to be wall-mounted. For example, the second electronic device 220 may be coupled with the bracket 230 using a coupling member 240.

In the case that the second electronic device 220 is separately wall-mounted regardless of the first electronic device 210, an additional bracket may be fixed onto the wall to mount the second electronic device 220 onto the wall, regardless of the first electronic device 210. Therefore, it may be difficult for the second electronic device 220 to be installed horizontally on the first electronic device 210 and to be mounted to have a specified distance from the first electronic device 210. A coupling apparatus of the present disclosure may couple the second electronic device 220 with the first electronic device 210 such that the first and second electronic devices 210 and 220 may be wall-mounted, together.

Figure 3A:
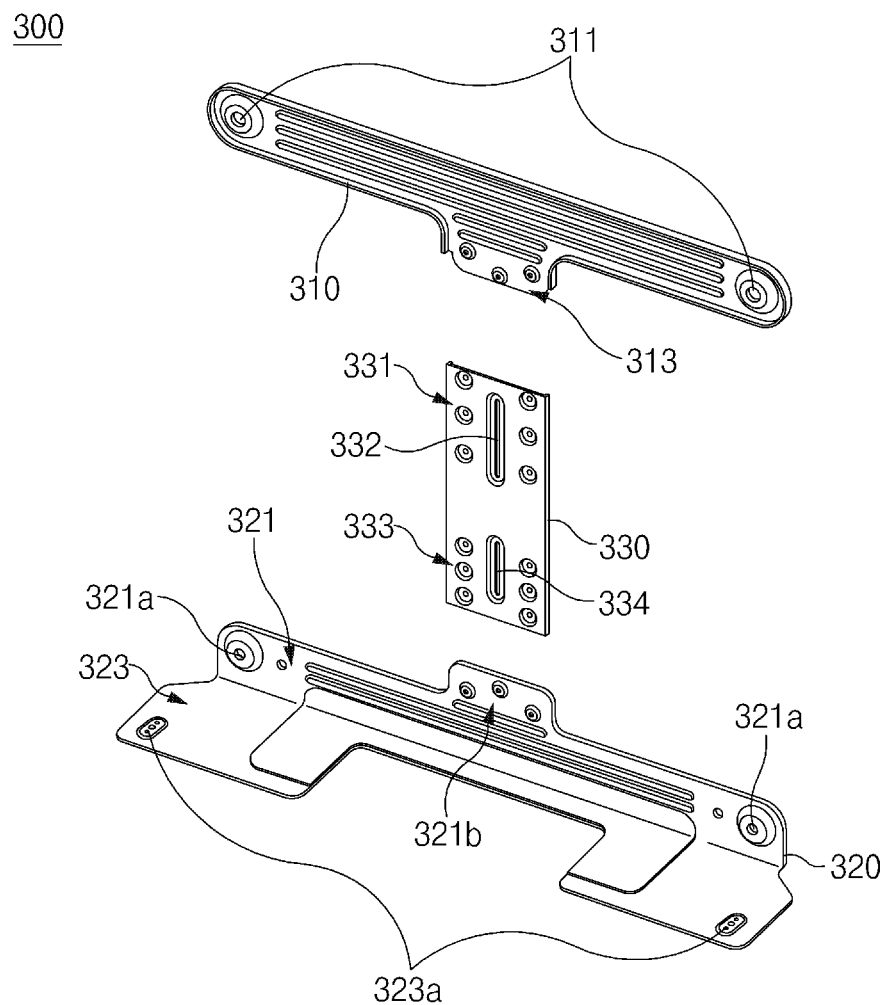
FIGS. 3A and 3B are views illustrating a coupling apparatus according to an embodiment of the present disclosure.
Figure 3B:
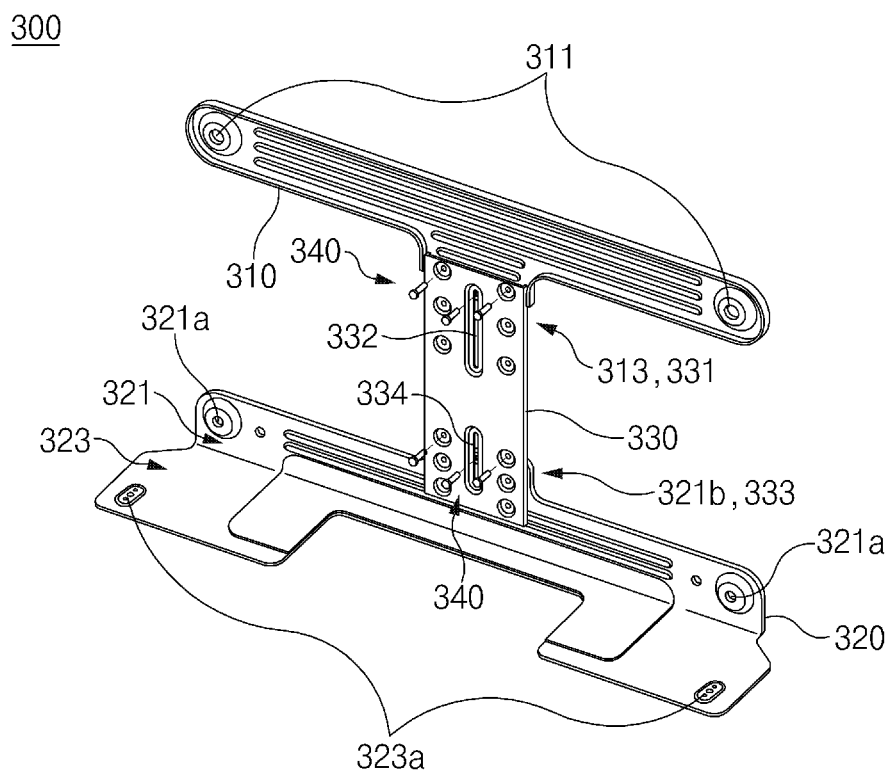

FIGS. 3A and 3B are views illustrating a coupling apparatus according to an embodiment of the present disclosure.

Referring to FIG. 3A, a coupling apparatus 300 may include a first coupling part 310, a second coupling part 320, and a connecting part 330. For example, the first coupling part 310 and the connecting part 330 may be an integrated element, physically. For another example, the second coupling part 320 and the connecting part 330 may be an integrated element, physically.

The first coupling part 310 may be coupled with the first electronic device. For example, the first coupling part 310 is generally plate-shaped. First coupling holes 311 may be formed in opposite ends of the first coupling part 310 to be coupled with the first electronic device. The first coupling holes 311, for example, may be formed according to a video electronics standards association (VESA) wall mount standard. Namely, the first coupling holes 311 formed in the opposite ends of the first coupling part 310 may be spaced apart from each other by a predetermined distance (e.g. about 75 mm).

According to an embodiment, the first coupling part 310 may be coupled with the connecting part 330. For example, a second coupling hole 313 may be formed in the first coupling part 310 to be coupled with the connecting part 330. The second coupling hole 313, for example, may be formed between the first coupling holes 311, which are formed in the opposite ends of the first coupling part 310. The second coupling hole 313 may be formed in a side surface (or a surface coupled with the connecting part 330) of the first coupling part 310. The second coupling hole 313 may include one hole set (e.g. one hole set including three coupling holes), which includes at least one coupling hole.

The second coupling part 320 may be coupled with the second electronic device. For example, the second coupling part 320 for supporting and coupling the second electronic device may include a first supporter 321 and a second supporter 323. The first supporter 321, for example, may be generally plate-shaped, and the second supporter 323 may be extended from the first supporter 321 in a vertical direction. In addition, the second supporter 323 may be extended in various directions depending on a shape of the second electronic device.

According to an embodiment, first coupling holes 321a may be formed in opposite ends of the first supporter 321 to be coupled with a supporting member. For example, in the case that the first and second electronic devices are mounted onto a wall together, the second electronic device may be supported by the supporting member to be wall-mounted. The supporting member will be explained in detail in FIGS. 6A, 6B, 6C and 6D.

According to an embodiment, the first supporter 321 may be coupled with the connecting part 330. For example, a second coupling hole 321b may be formed in the second coupling part 320 to be coupled with the connecting part 330. The second coupling hole 321b, for example, may be formed between the first coupling holes 321a, which are formed in the opposite ends of the first supporter 321. The second coupling hole 321b may be formed in a side surface (or a surface coupled with the connecting part 330) of the first supporter 321. The second coupling hole 321b may include one hole set (e.g. one hole set including three coupling holes), which includes at least one coupling hole.

According to an embodiment, the second supporter 323 may be coupled with the second electronic device. For example, opposite ends of the second supporter 323 may protrude from the opposite ends of the first supporter 321 to support the second electronic device stably. Third coupling holes 323a may be formed in the opposite ends of the second supporter 323 to be coupled with the second electronic device.

The connecting part 330 may be coupled with the first coupling part 310. For example, the connecting part 330 may be generally plate-shaped. A first plurality of coupling holes 331 may be formed in one end of the connecting part 330 to be coupled with the first coupling part 310. The first plurality of coupling holes 331, for example, may include a plurality of hole sets (e.g. three hole sets, each of which includes three coupling holes), each of which includes at least one coupling hole. A hole set of the first plurality of coupling holes 331 may be formed to correspond to the second coupling hole 313 of the first coupling part 310. A hole included in the first plurality of coupling holes 331 may be formed in a direction substantially perpendicular to an arrangement direction of the hole set and may be included in the plurality of hole sets. The first plurality of coupling holes 331 may include a first guide hole 332 which is extended vertically so that when the coupling member 340 (See FIG. 3B) temporarily couples the first coupling apart with the connection part, the coupling member 340 may be guided by the first guide hole 332 in order to align other ones of the first plurality of coupling holes 331 with corresponding second coupling hole 313. Therefore, the distance between the first coupling part 310 and the second coupling part 320 may be adjusted.

According to an embodiment, the connecting part 330 may be coupled with the second coupling part 320. A second plurality of coupling holes 333 may be formed in the other end of the connecting part 330 to be coupled with the second coupling part 320. The second plurality of coupling holes 333, for example, may include a plurality of hole sets (e.g. three hole sets, each of which includes three coupling holes), each of which includes at least one coupling hole. A hole set of the second plurality of coupling holes 333 may be formed to correspond to the second coupling hole 321b of the second coupling part 320. A hole included in the second plurality of coupling holes 333 may be formed in a direction substantially perpendicular to an arrangement direction of the hole set and may be included in the plurality of hole sets. The second plurality of coupling holes 333 may include a second guide hole 334 which is extended vertically so that when the coupling member 340 (See FIG. 3B) temporarily couples the second coupling part 320 with the connecting part 330 the coupling member 340 may be guided by the second guide hole 334 in order to align other ones of the second plurality of coupling holes 333 with the corresponding second coupling hole 321b of the second coupling part 320. Therefore, the distance between the first coupling part 310 and the second coupling part 320 may be adjusted.

According to an embodiment, the plurality of hole sets of the first plurality of coupling holes 331 may be spaced apart from each other by a first distance. The plurality of hole sets of the second plurality of coupling holes 333 may be spaced apart from each other by a second distance. For example, the first distance may be different from the second distance.

Referring to FIG. 3B, the first coupling part 310, the second coupling part 320, and the connecting part 330 may be coupled with one another.

The first coupling part 310 may be coupled with the connecting part 330. For example, the first coupling part 310 may be coupled with the connecting part 330 through the second coupling hole 313 of the first coupling part 310 and the first plurality of coupling holes 331 of the connecting part 330. Coupling members 340 (e.g. screws) may combine the first coupling part 310 with the connecting part 330 through the second coupling hole 313 and the first plurality of coupling holes 331.

According to an embodiment, the connecting part 330 may be coupled with the first coupling part 310 through some of the first plurality of coupling holes 331. For example, the connecting part 330 may be coupled with the first coupling part 310 through one hole set of the first plurality of coupling holes 331 (e.g. one hole set including at least one coupling hole), which corresponds to the second coupling hole 313 of the first coupling part 310. Accordingly, a position where the first coupling part 310 is coupled with the connecting part 330 may depend on a hole of the first plurality of coupling holes 331 in the connecting part 330, which is coupled with the first coupling part 310.

The second coupling part 320 may be coupled with the connecting part 330. For example, the second coupling part 320 may be coupled with the connecting part 330 through the second coupling hole 321b of the second coupling part 320 and the second plurality of coupling holes 333 of the connecting part 330. Coupling members 340 (e.g. screws) may combine the second coupling part 320 with the connecting part 330 through the second coupling hole 321b and the second plurality of coupling holes 333.

According to an embodiment, the connecting part 330 may be coupled with the second coupling part 320 through some of the second plurality of coupling holes 333. For example, the connecting part 330 may be coupled with the second coupling part 320 through one hole set of the second plurality of coupling holes 333, which corresponds to the second coupling hole 321b of the second coupling part 320. Accordingly, a position where the second coupling part 320 is coupled with the connecting part 330 may depend on a hole of the second plurality of coupling holes 333 in the connecting part 330, which is coupled with the second coupling part 320.

According to an embodiment, a distance between the first coupling part 310 and the second coupling part 320 may be adjusted depending on a position where at least one of the first coupling part 310 and the second coupling part 320 is coupled with the connecting part 330. For example, in the case that at least one of the first coupling part 310 and the second coupling part 320 is coupled with a coupling hole (or a hole set including at least one of coupling holes) disposed adjacent to a central region of the connecting part 330, the distance between the first coupling part 310 and the second coupling part 320 may be small. For another example, in the case that at least one of the first coupling part 310 and the second coupling part 320 is coupled with a coupling hole (or a hole set including at least one of coupling holes) distant from the central region of the connecting part 330, the distance between the first coupling part 310 and the second coupling part 320 may be great.

According to an embodiment, the first distance of the first plurality of coupling holes 331 of the connecting part 330 may be different from the second distance of the second plurality of coupling holes 333. When the first distance (e.g. 20 mm) and the second distance (e.g. about 30 mm) is different from each other, the distance between the first coupling part 310 and second coupling part 320 may be adjusted minutely (e.g. about 10 mm).

Therefore, a distance between the first electronic device coupled with the first coupling part 310 and the second electronic device coupled with the second coupling part 320 may be adjusted.

Figure 4:
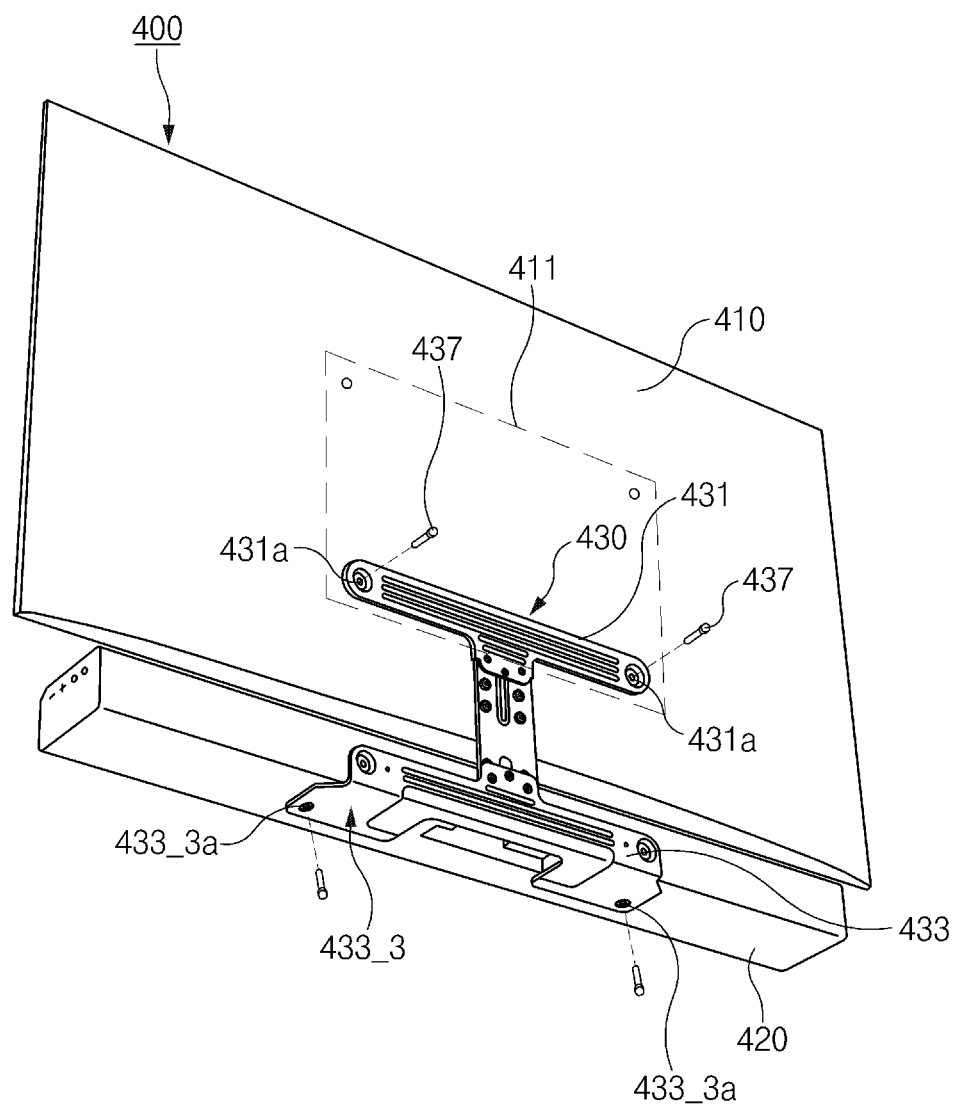
FIG. 4 is a rear view illustrating a coupling apparatus according to an embodiment of the present disclosure, which is coupled with a first electronic device and a second electronic device.

FIG. 4 is a rear view illustrating a coupling apparatus according to an embodiment of the present disclosure, which is coupled with a first electronic device and a second electronic device.

Referring to FIG. 4, first and second electronic devices 410 and 420 of a display system 400 may be connected to each other by a coupling apparatus 430. The coupling apparatus 430 explained in FIG. 4 may be the same as the coupling apparatus 300 of FIGS. 3A and 3B.

A first coupling part 431 of the coupling apparatus 430 may be coupled with the first electronic device 410. For example, the first coupling part 431 may be coupled with a rear surface of the first electronic device 410. The first coupling part 431 may be coupled with the first electronic device 410 through and first coupling holes 431a of the first coupling part 431 and a plurality of VESA holes 411 (e.g. four coupling holes), which are formed in the rear surface of the first electronic device 410 according to a VESA wall mount standard using a coupling member 437. The first coupling part 431 may be coupled with the first electronic device 410 through first coupling holes 431a and holes, which are disposed at a lower side, of the plurality of VESA holes 411 (e.g. two coupling holes disposed at the lower side).

A second coupling part 433 of the coupling apparatus 430 may be coupled with the second electronic device 420. For example, the second coupling part 433 may be coupled with at least one of a rear surface and a bottom surface of the second electronic device 420. The second coupling part 433, for example, may be coupled with the bottom surface of the second electronic device 420. Namely, the second coupling part 433 may be coupled with the second electronic device 420 through a second coupling hole 433_3a formed in a second supporter 433_3.

Figure 5:
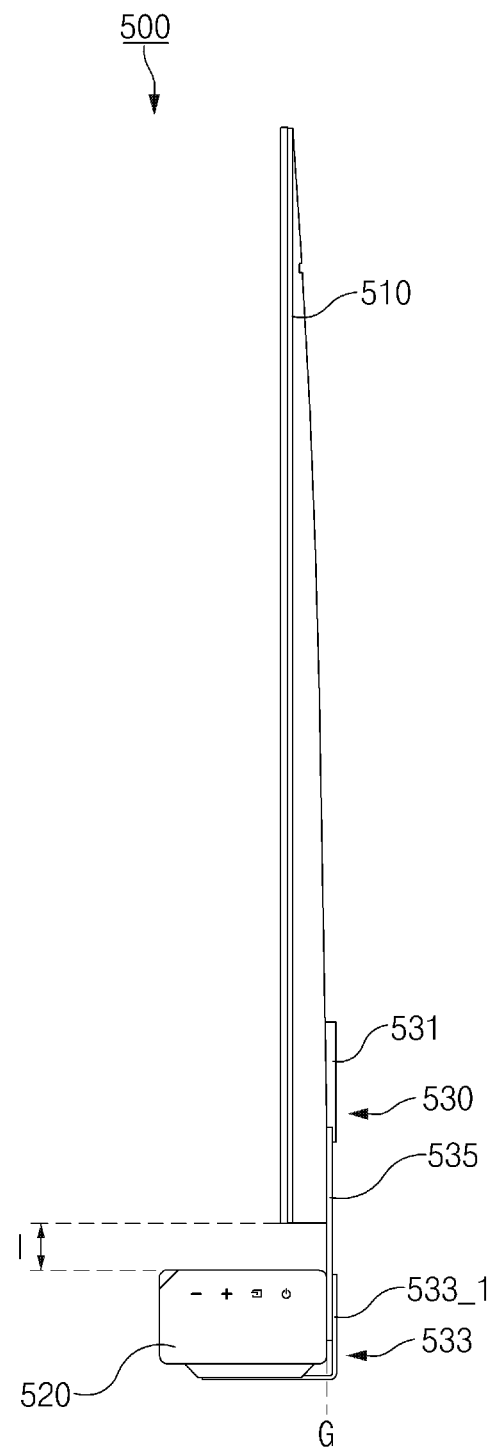
FIG. 5 is a side view illustrating that a first electronic device and a second electronic device are connected by a coupling apparatus according to an embodiment of the present disclosure.

FIG. 5 is a side view illustrating that a coupling apparatus is coupled with a first electronic device and a second electronic device according to an embodiment of the present disclosure.

Referring to FIG. 5, a second electronic device 520 of a display system 500 may be mounted through a coupling apparatus 530 at a predetermined position from a first electronic device 510. The coupling apparatus 530 explained in FIG. 5 may be the same as the coupling apparatus 430 of FIG. 4.

The second electronic device 520 may be spaced apart from the first electronic device 510 by a predetermined distance "I" through the coupling apparatus 530. The predetermined distance "I" may depend on a position where at least one of a first coupling part 531 and a second coupling part 533 of the coupling apparatus 530 is coupled with a connecting part 535.

According to an embodiment, a rear surface of the second electronic device 520 and a rear surface of the first electronic device 510 may be positioned on a coplanar plane "G" by the coupling apparatus 530, substantially. The first coupling part 531 of the coupling apparatus 530 and a first supporter 533_1 of the second coupling part 533 may be positioned on the coplanar plane "G", substantially. Accordingly, the rear surface of the first electronic device 510 coupled with the first coupling part 531 and the rear surface of the second electronic device 520 supported by the second coupling part 533 may be positioned on the coplanar plane "G", substantially.

FIGS. 6A to 6D are views illustrating that a supporter is connected to a coupling apparatus according to an embodiment of the present disclosure.

Referring to FIGS. 6A to 6D, a first electronic device 610 and a second electronic device 620 of a display system 600 may be connected by a coupling apparatus 630. The coupling apparatus 630 may add a third supporter 633_5 on elements of the coupling apparatus 530 of FIG. 5.

Figure 6A:
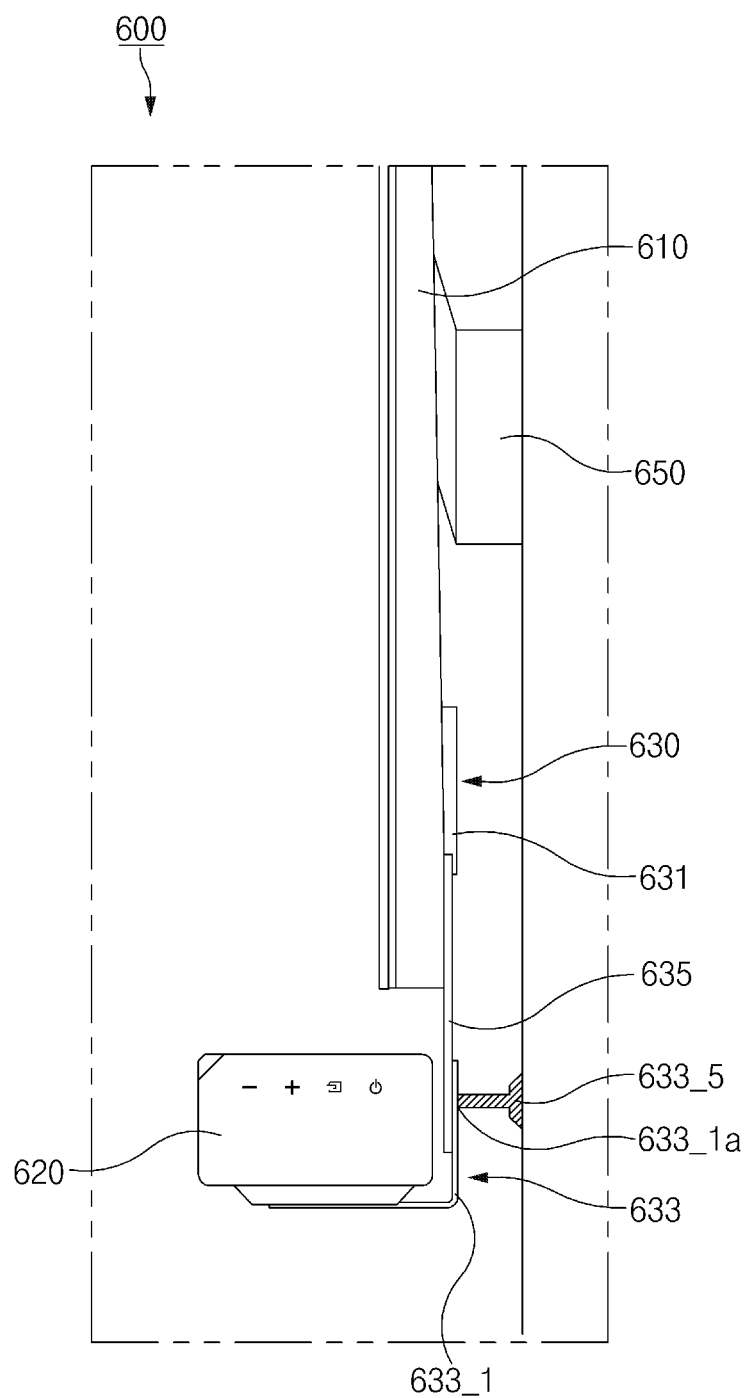
FIGS. 6A, 6B, 6C and 6D are views illustrating that a coupling apparatus is connected to a supporter according to an embodiment of the present disclosure.

Referring to FIG. 6A, the first electronic device 610 may be mounted onto a wall by a wall-mount device 650, on condition that the second electronic device 620 is connected to the first electronic device 610. The first electronic device 610 may be coupled with a first coupling part 631 of the coupling apparatus 630. The second electronic device 620 may be supported by the third supporter 633_5 onto the wall. For example, the third supporter 633_5 may be disposed between a first supporter 633_1 and the wall to be in contact with the wall, and therefore the first supporter 633_1 may be supported onto the wall.

According to an embodiment, the third supporter 633_5 may be coupled with the first supporter 633_1 of a second coupling part 633. For example, the third supporter 633_5 may be coupled through a first coupling hole 633_1a of the of the first supporter 633_1. The second coupling part 633 may be coupled with the first coupling part 631 by a connecting part 635.

Figure 6B:
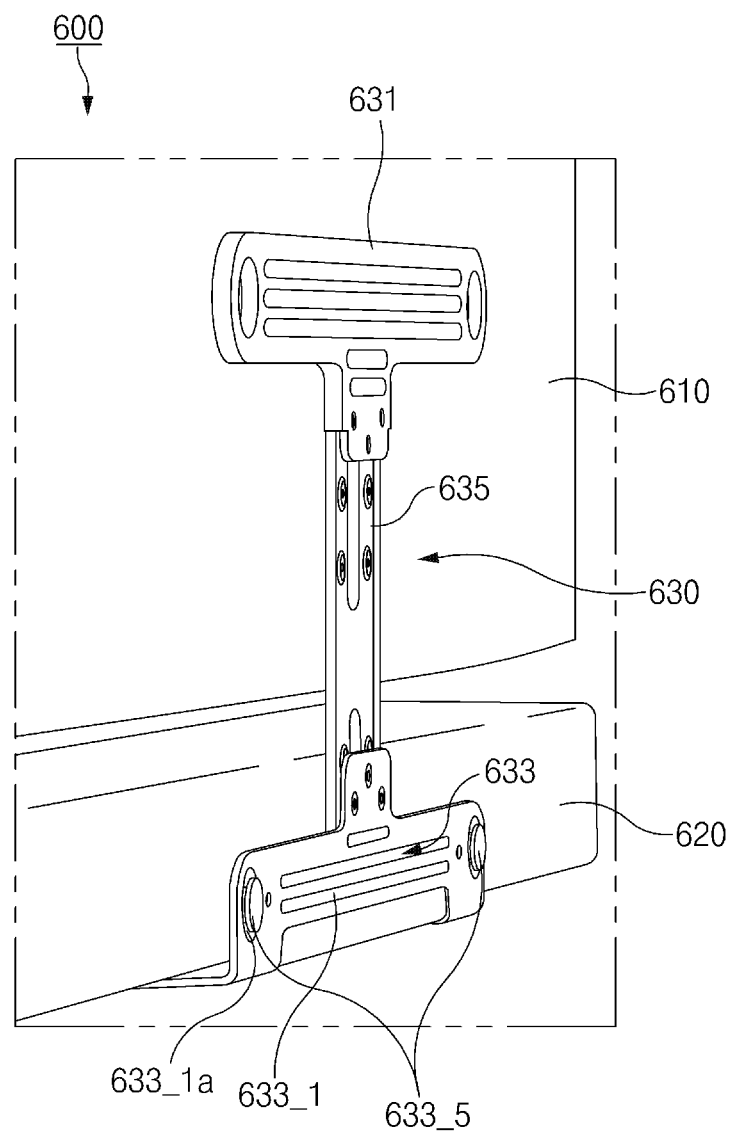
Figure 6C:
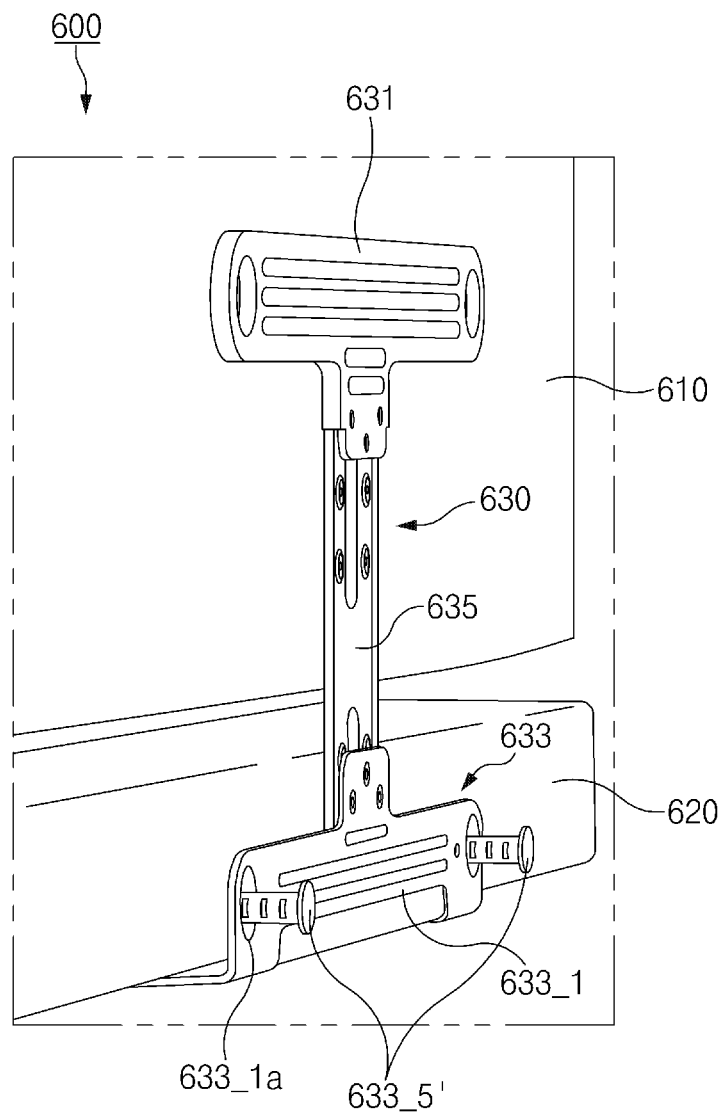

According to an embodiment, a length of the third supporter 633_5 which extends toward the wall may be adjusted depending on a distance between the first supporter 633_1 and the wall. For example, a length of the third supporter 633_5 which is inserted into the first coupling hole 633_1a of the first supporter 633_1 may be adjusted, and therefore the length of the third supporter 633_5 which extends toward the wall may be adjusted. Referring to FIG. 6B, in the case that a distance between the first supporter 633_1 and the wall is small, the third supporter 633_5 may be deeply inserted into the first coupling hole 633_1a, and therefore the length of the third supporter 633_5 which extends toward the wall may be small. Referring to FIG. 6C, in the case that the distance between the first supporter 633_1 and the wall is great, the third supporter 633_5' may be shortly inserted into the first coupling hole 633_1a, and therefore the length of the third supporter 633_5' which extends toward the wall may be great.

Figure 6D:
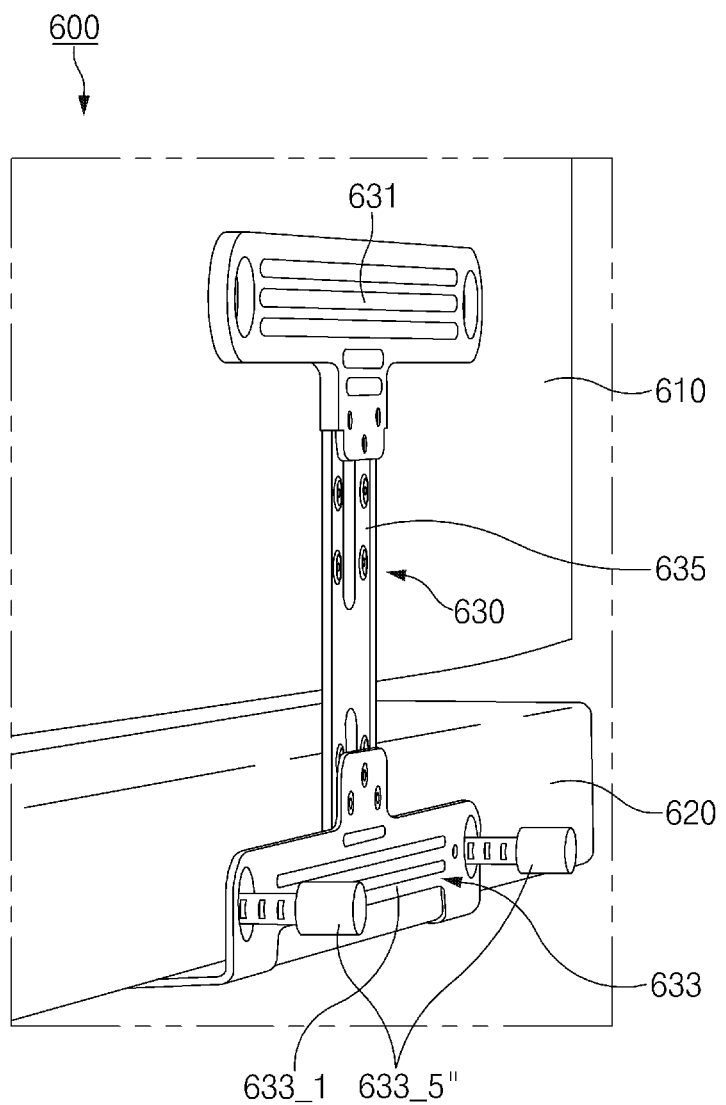

Referring to FIG. 6D, a member for maintaining the distance between the wall and the third supporter 633_5" may be coupled with the third supporter 633_5" exposed to the wall. The member for maintaining the distance, for example, may be formed on an outer circumference of the third supporter 633_5" to have a predetermined length. The member for maintaining the distance may prevent the third supporter 633_5" from being inserted into the first coupling hole 633_1a by an external force.

Referring to an embodiment, the third supporter 633_5 may be formed of a material and a shape which are able to support the first supporter 633_1 onto the wall since the third supporter 633_5 is coupled with the first supporter 633_1. For example, the third supporter 633_5 may include a pin or a screw which is formed of at least one of rubber, plastic, wood, and metal.

Accordingly, in the case that the first electronic device 610 is mounted onto the wall, on condition that the second electronic device 620 is connected to the first electronic device 610, the second electronic device 620 may be supported by the third supporter 633_5, and therefore vibration generated upon operation of the second electronic device 620 may be reduced and the first electronic device 610 may be stably mounted onto the wall.

Figure 7:
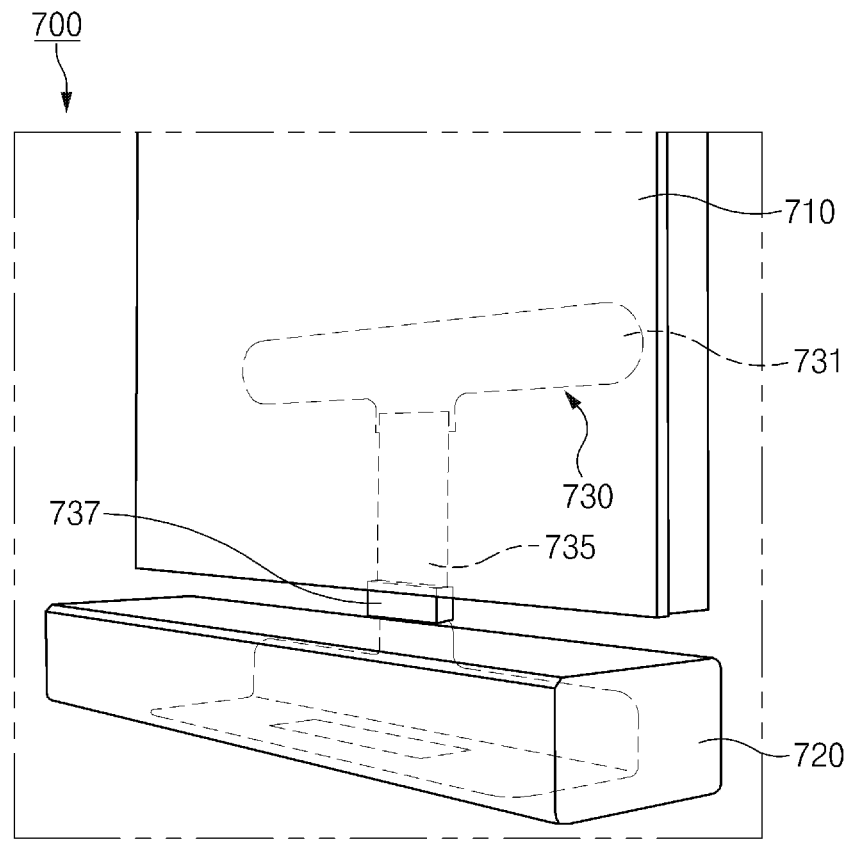
FIG. 7 is a view illustrating that a molding part is coupled with a coupling apparatus according to an embodiment of the present disclosure.

FIG. 7 is a view illustrating that a molding part is coupled with a coupling apparatus according to an embodiment of the present disclosure.

Referring to FIG. 7, a first electronic device 710 and a second electronic device 720 of a display system 700 may be connected each other by a coupling apparatus 730, and the coupling apparatus 730 may add a molding part 737 on elements of the coupling apparatus 530 of the FIG. 5.

According to an embodiment, the molding part 737 may be coupled with a connecting part 735. For example, the molding part 737 may be coupled with the connecting part 735 to cover the connecting part 735. According to an embodiment, when the first electronic device 710 and the second electronic device 720 are connected by the coupling apparatus 730, the molding part 737 may be positioned between the first electronic device 710 and the second electronic device 720.

Accordingly, the connecting part 735 exposed between the first electronic device 710 and the second electronic device 720 may be covered by the molding part 737 not to be exposed to front faces of the first and second electronic devices 710 and 720. In addition, a wired member (e.g. a wired member for transmitting and receiving audio signals and a wired member for power) connecting the first electronic device 710 and the second electronic device 720 may be disposed between the connecting part 735 and the molding part 737, and therefore the coupling part 735 is not exposed to the front faces of the first and second electronic devices 710 and 720.

According to various embodiments of the present disclosure described with reference to FIGS. 1 to 7, since the coupling apparatus couples the second electronic device with the first electronic device, the first electronic device and second electronic device may be mounted onto the wall together, without an additional bracket. In addition, since the position of the coupling apparatus coupling the first electronic device with the second electronic device is changed, the distance between the first electronic device and the second electronic device may be adjusted.

The term "module" used herein may represent, for example, a part including one or more combinations of hardware, software and firmware. The term "module" may be interchangeably used with the terms "part", "logic", "logical block", "component" and "circuit". The "module" may be a minimum part of an integrated component or may be a part thereof. The "module" may be a minimum part for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor, may cause one or more processors to perform a function corresponding to the instruction. The computer-readable storage media, for example, may be a memory.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware part may be configured to operate via one or more software modules for performing an operation according to various embodiments, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

According to embodiments disclosed in the present disclosure, the second electronic device (e.g. a speaker device) is connected to the first electronic device (e.g. a display device), and therefore the second electronic device and the first electronic device may be mounted onto the wall without a separate bracket, together. The distance between the first electronic device and the second electronic device may be adjusted depending on the position where the first electronic device and the second electronic device are coupled with the coupling apparatus. In addition, in the case that the second electronic device and the first electronic device are wall-mounted, together, the second electronic may be stably supported using the supporters, which support the coupling apparatus onto the wall, onto the wall, where the first electronic device is mounted.

In addition, the apparatus may provide a variety of effects ascertained directly or indirectly through the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A coupling apparatus to mount a second electronic device to a first electronic device, the coupling apparatus comprising:

a first coupling part configured to be coupled with the first electronic device, the first coupling part having coupling holes spaced apart and aligned horizontally;

a second coupling part configured to be coupled with the second electronic device, the second coupling part having coupling holes spaced apart and aligned horizontally, a supporting member coupling hole, and a supporting member configured to be inserted and movable inside the supporting member coupling hole and make contact with a wall, wherein, while the first electronic device is mounted onto the wall, a length extending from the second coupling part toward the wall of the supporting member is configured to be adjustable based on a distance between a portion of the second coupling part and the wall; and a connecting part comprising:

a first plurality of coupling hole sets formed in one end region of the connecting part, each of the first plurality of coupling hole sets having coupling holes spaced apart and aligned horizontally;

a second plurality of coupling hole sets formed in an opposite end region of the connecting part, each of the second coupling hole sets having coupling holes spaced apart and aligned horizontally; and
an elongated guide hole enclosed by the connecting part and formed so that the elongated guide hole extends vertically between each of the spaced apart and aligned horizontally holes of the first plurality of coupling hole sets and is aligned horizontally with each of the spaced apart and aligned horizontally holes of the first plurality of coupling hole sets,
wherein
the elongated guide hole is configured to allow a user to insert a first coupling member, that extends through the elongated guide hole to the first coupling part, to allow the user to move the first plurality of coupling hole sets in a vertical direction, so that the first plurality of coupling hole sets align with the coupling holes spaced apart and aligned horizontally of the first coupling part,
wherein the connecting part is configured to
be coupled with the first coupling part using a coupling hole set from the first plurality of coupling hole sets, and be coupled with the second coupling part using a coupling hole set from the second plurality of coupling hole sets, such that the first coupling part and the second coupling part are connected through the connecting part,
wherein neighboring coupling hole sets of the first plurality of coupling hole sets are spaced apart from each other by a first distance,
wherein neighboring coupling hole sets of the second plurality of coupling hole sets are spaced apart from each other by a second distance,
wherein the first distance is different to the second distance, and
wherein a distance between the first coupling part and the second coupling part is adjustable depending on which coupling hole set of the first plurality of coupling hole sets the first coupling part couples to and which coupling hole set of the second plurality of coupling hole sets the second coupling part couples to.

2. The coupling apparatus of claim 1, wherein the coupling holes of the first coupling part are formed according to a video electronics standards association (VESA) wall mount standard and is arranged to be coupled with the first electronic device through the coupling holes of the first coupling part.

3. The coupling apparatus of claim 2, wherein the first coupling part is coupled with the first electronic device through the coupling holes of the first coupling part and coupling holes formed in the first electronic device according to the VESA wall mount standard.

4. The coupling apparatus of claim 1, wherein the first coupling part and the connecting part are integrated into one element.

5. The coupling apparatus of claim 1, wherein the second coupling part and the connecting part is integrated into one element.

6. The coupling apparatus of claim 1, wherein the first coupling part is coupled with a rear surface of the first electronic device,
wherein the second coupling part includes a first supporter supporting a rear surface of the second electronic device and a second supporter supporting a bottom surface of the second electronic device, and
wherein the second electronic device is coupled with at least one of the first supporter and the second supporter.

7. The coupling apparatus of claim 6, wherein, when the first electronic device and the second electronic device are connected to each other by the coupling apparatus, and
wherein the first coupling part and the first supporter are positioned on a coplanar plane.

8. The coupling apparatus of claim 6, wherein the supporting member is coupled with the first supporter, and
wherein, when the first electronic device is mounted onto a wall, the second electronic device is supported by the supporting member to be mounted onto the wall.

9. The coupling apparatus of claim 6, wherein the supporting member includes a pin or a screw, which is formed of at least one of rubber, plastic, wood, and metal.

10. The coupling apparatus of claim 1, further comprising:
a molding part coupled with the connecting part, and
wherein the molding part is positioned between the first electronic device and the second electronic device when the first electronic device and the second electronic device are connected by the coupling apparatus.

11. The coupling apparatus of claim 1, wherein the first electronic device includes a display device, and
wherein the second electronic device includes a speaker device.

12. A display device comprising:
a housing to form an outer appearance of the display device, the house having an open surface;
a display placed in the housing and having one surface exposed to an outside through the opening surface of the housing; and
a coupling apparatus to be coupled with the housing and an external electronic device, the coupling apparatus to mount the external electronic device to the display device, the coupling apparatus including:
a first coupling part configured to be coupled with the housing, the first coupling part having coupling holes spaced apart and aligned horizontally;
a second coupling part configured to be coupled with the external electronic device, the second coupling part having coupling holes spaced apart and aligned horizontally, a supporting member coupling hole, and a supporting member configured to be inserted and movable inside the supporting member coupling hole and make to contact with a wall,
wherein, while the first electronic device is mounted onto the wall, a length extending from the second coupling part toward the wall of the supporting member is configured to be adjustable based on a distance between a portion of the second coupling part and the wall; and
a connecting part comprising:
a first plurality of coupling hole sets formed in one end region of the connecting part, each of the first plurality of coupling hole sets having coupling holes spaced apart and aligned horizontally;
a second plurality of coupling hole sets formed in an opposite end region of the connecting part, each of the second coupling hole sets having coupling holes that are spaced apart and aligned horizontally; and
an elongated guide hole enclosed by the connecting part and formed so that the elongated guide hole extends vertically between each of the spaced apart and aligned horizontally holes of the first plurality of coupling hole sets and is aligned horizontally with the each of the spaced apart and aligned horizontally holes of the first plurality of coupling hole sets,
wherein the elongated guide hole is configured to allow a user to insert a first coupling member, that extends through the elongated guide hole to the first coupling part, to allow the user to move the first plurality of coupling hole sets in a vertical direction, so that the first plurality of coupling hole sets align with the coupling holes spaced apart and aligned horizontally of the first coupling part, wherein the connecting part is configured to to be coupled with the first coupling part using a coupling hole set from the first plurality of coupling hole sets, and be coupled with the second coupling part using a coupling hole set from the second plurality of coupling hole sets, such that the first coupling part and the second coupling part are connected through the connecting part, and wherein neighboring coupling hole sets of the first plurality of coupling hole sets are spaced apart from each other by a first distance, wherein neighboring coupling hole sets of the second plurality of coupling hole sets are spaced apart from each other by a second distance, wherein the first distance is different to the second distance, and wherein a distance between the first coupling part and the second coupling part is adjustable depending on which coupling hole set of the first plurality of coupling hole sets the first coupling part couples to and which coupling hole set of the second plurality of coupling hole sets the second coupling part couples to.

13. A speaker device comprising:

a housing to form an outer appearance of the speaker device;

a speaker placed in the housing; and a coupling apparatus to be coupled with the housing and external electronic device, wherein the coupling apparatus to mount the speaker device to the external electronic device, the coupling apparatus includes:

a first coupling part configured to be coupled with an external electronic device the first coupling part having coupling holes spaced apart and aligned horizontally;

a second coupling part configured to be coupled with the housing, the second coupling part having coupling holes spaced apart and aligned horizontally, a supporting member coupling hole, and a supporting member configured to be inserted and movable inside the supporting member coupling hole and make contact with a wall, wherein, while the first electronic device is mounted onto the wall, a length extending from the second coupling part toward the wall of the supporting member is configured to be adjustable based on a distance between a portion of the second coupling part and the wall; and a connecting part comprising:

a first plurality of coupling hole sets formed in one end region of the connecting part, each of the first plurality of coupling hole sets having coupling holes spaced apart and aligned horizontally;

a second plurality of coupling hole sets formed in an opposite end region of the connecting part, each of the second coupling hole sets having coupling holes that are spaced apart and aligned horizontally; and an elongated guide hole enclosed by the connecting part and formed so that the elongated guide hole extends vertically between each of the spaced apart and aligned horizontally holes of the first plurality of coupling hole sets and is aligned horizontally with each of the spaced apart and aligned horizontally holes of the first plurality of coupling hole sets, wherein the elongated guide hole is configured to allow a user to insert a first coupling member, that extends through the elongated guide hole to the first coupling part, to allow the user to move the first plurality of coupling hole sets in a vertical direction, so that the first plurality of coupling hole sets align with the coupling holes spaced apart and aligned horizontally of the first coupling part, wherein the connecting part is configured to be coupled with the first coupling part using a coupling hole set from the first plurality of coupling hole sets, and to be coupled with the second coupling part using a coupling hole set from the second plurality of coupling hole sets, such that the first coupling part and the second coupling part are connected through the connecting part, and wherein neighboring coupling hole sets of the first plurality of coupling hole sets are spaced apart from each other by a first distance, wherein neighboring coupling hole sets of the second plurality of coupling hole sets are spaced apart from each other by a second distance, wherein the first distance is different to the second distance, and wherein a distance between the first coupling part and the second coupling part is adjustable depending on which coupling hole set of the first plurality of coupling hole sets the first coupling part couples to, and which coupling hole set of the second plurality of coupling hole sets the second coupling part couples to.

* * * * *